US012688892B2

(12) United States Patent　　　(10) Patent No.:　US 12,688,892 B2

Lee et al.　　　(45) Date of Patent:　Jul. 21, 2026

(54) METHOD OF OPTIMIZING ERASURE AND PROGRAMMING PASS VOLTAGE

(71) Applicant: Winbond Electronics Corp., Taichung City (TW)

(72) Inventors: Cheng Han Lee, Taichung (TW); Fang Li Li, Taichung (TW); Jun-Yao Huang, Hsinchu (TW)

(73) Assignee: Winbond Electronics Corp., Taichung City (TW)

( * ) Notice: Subject to any disclaimer, the term of this patent is extended or adjusted under 35 U.S.C. 154(b) by 129 days.

(21) Appl. No.: 18/657,789

(22) Filed: May 8, 2024

(65) Prior Publication Data

US 2025/0246241 A1　　Jul. 31, 2025

(30) Foreign Application Priority Data

Jan. 26, 2024　(TW) ................................. 113103103

(51) Int. Cl.
　*G11C 16/10*　　(2006.01)
　*G11C 11/419*　　(2006.01)
　*G11C 13/00*　　(2006.01)
　*G11C 16/04*　　(2006.01)
　*G11C 16/34*　　(2006.01)

(52) U.S. Cl.
　CPC .......... *G11C 16/102* (2013.01); *G11C 11/419* (2013.01); *G11C 13/0033* (2013.01); *G11C 16/0483* (2013.01); *G11C 16/3418* (2013.01); *G11C 16/3427* (2013.01)

(58) Field of Classification Search
　CPC . G11C 16/102; G11C 11/419; G11C 13/0033; G11C 16/0483; G11C 16/3418; G11C 16/3427; G11C 16/30; G11C 16/3404
　See application file for complete search history.

(56) References Cited

U.S. PATENT DOCUMENTS

2015/0071008 A1*　3/2015　Yang ................... G11C 16/0483
　　　　　　　　　　　　　　　　　　365/185.23
2015/0170746 A1*　6/2015　Oowada ................. G11C 16/10
　　　　　　　　　　　　　　　　　　365/185.18
2018/0075916 A1*　3/2018　Lee ......................... G11C 16/26
2021/0398593 A1*　12/2021　Song ...................... G11C 16/08
2024/0420767 A1*　12/2024　Wang ................... G11C 11/5628

* cited by examiner

*Primary Examiner* — Donald H B Braswell

(74) *Attorney, Agent, or Firm* — JCIPRNET

(57)　　　　　ABSTRACT

Provided is a method of optimizing pass voltage including: determining a sweet point of an initial pass voltage; monitoring a pulse number of ISPP; obtaining a shift of a low boundary value of the pass voltage by a shift of the pulse number of the ISPP at different cycles; monitoring a pulse number of ISPE; obtaining a shift of a high boundary value of the pass voltage by a shift of the pulse number of the ISPE at the different cycles; adding the shift of the high boundary value and the shift of the low boundary value and dividing by 2 to get a shift of the sweet point of the pass voltage; and adding the sweet point of the initial pass voltage and the shift of the sweet point of the pass voltage to obtain an optimized pass voltage value.

18 Claims, 6 Drawing Sheets

ISPP

ISPE

METHOD OF OPTIMIZING ERASURE AND PROGRAMMING PASS VOLTAGE

CROSS-REFERENCE TO RELATED APPLICATION

This application claims the priority benefit of Taiwan application serial no. 113103103, filed on Jan. 26, 2024. The entirety of the above-mentioned patent application is hereby incorporated by reference herein and made a part of this specification.

BACKGROUND

Technical Field

The disclosure relates to a method of optimizing pass voltage.

Description of Related Art

In flash memory, when data is programmed, electrons accumulate in a floating gate, and a threshold voltage of a memory cell shifts in a positive direction; when data is erased, the electrons are released from the floating gate, and the threshold voltage of the memory cell shifts in a negative direction. This kind of programming and erasing control allows the threshold value of the memory cell enters a distribution width of "0" and "1". In the case where the memory cell stores multiple bits, further control is required to make the threshold value of the memory cell fall within the distribution width of "00", "01", "10", and "11".

To control the threshold distribution of the memory cells, the memory cells are erased using incremental step pulse erase (ISPE). As shown in FIG. 1A, the ISPE applies an erase pulse Vers0 to a P-Well of a selected block. If the verification of the erasing fails, applies an erase pulse Vers1 at a step voltage higher than the erase pulse Vers0, so that the voltage of the erase pulse increases until the erasing of all of the memory cells in the block is judged to be passed The same applies to programming. To accurately inject electrons into the memory cells, incremental step pulse program (ISPP) can be used. As shown in FIG. 1B, the ISPP applies a program pulse Vpgm0 to a selected page, and if the verification of the programming fails, applies a program pulse Vpgm1 at a step voltage higher than the program pulse Vpgm0, so that the voltage of the program pulse increases until the programming of all of the memory cells in the page is judged to be passed.

SUMMARY

The disclosure provides a method of optimizing pass voltage, which may dynamically adjust a sweet point of the pass voltage so that the pass voltage continuously be located between a high boundary (HB) value and a low boundary (LB) value that converge as the cycle count increases, thereby reducing the fail bit count and effectively improving yield and reliability.

The disclosure provides a method of optimizing pass voltage, including: determining a sweet point of an initial pass voltage; monitoring a pulse number of an ISPP; obtaining a shift of a low boundary value of the pass voltage by a shift of the pulse number of the ISPP at different cycles; monitoring a pulse number of an ISPE; obtaining a shift of a high boundary value of the pass voltage by a shift of the pulse number of the ISPE at the different cycles; adding the shift of the high boundary value and the shift of the low boundary value and dividing by 2 to get a shift of the sweet point of the pass voltage; and adding the sweet point of the initial pass voltage and the shift of the sweet point of the pass voltage to obtain an optimized pass voltage value.

In an embodiment of the disclosure, obtaining the shift of the low boundary value of the pass voltage by the shift of the pulse number of the ISPP at the different cycles includes: monitoring a first pulse number $X1$ of the ISPP at a first cycle; monitoring a second pulse number $X2$ of the ISPP at a second cycle; and putting the first pulse number $X1$ and the second pulse number $X2$ into an equation (1) to calculate the shift of the low boundary of the pass voltage, $$Y1 = -a(X2 - X1) \tag{1}$$

$Y1$ is the shift of the low boundary of the pass voltage, and $a$ is a constant greater than zero.

In an embodiment of the disclosure, the $a$ is greater than zero and less than 1.

In an embodiment of the disclosure, obtaining the shift of the high boundary value of the pass voltage by the shift of the pulse number of the ISPE at the different cycles includes: monitoring a third pulse number $X3$ of the ISPE at the first cycle; monitoring a fourth pulse number $X4$ of the ISPP at the second cycle; and putting the third pulse number $X3$ and the fourth pulse number $X4$ into an equation (2) to calculate the shift of the high boundary value of the pass voltage, $$Y2 = -b(X4 - X3) \tag{2}$$

$Y2$ is the shift of the high boundary value of the pass voltage, and $b$ is a constant greater than zero.

In an embodiment of the disclosure, the $b$ is greater than zero and less than 1, the pulse number the ISPP decreases as the cycle count increases, the low boundary value of the pass voltage increases as the cycle count increases, the pulse number of the ISPE increases as the cycle count increases, the high boundary value of the pass voltage decreases as the cycle count increases.

DESCRIPTION OF THE EMBODIMENTS

A semiconductor element in the embodiment of the disclosure is, for example, a NAND flash memory, or a microprocessor, a microcontroller, a logic, and an application specific integrated circuits (ASIC) embedded in such flash memories, a processor that processes images and sounds, a signal processor that processes wireless signals, etc. A memory element in the following embodiments is explained by taking a NAND flash memory as an example, but the disclosure is not limited thereto.

Figure 2:
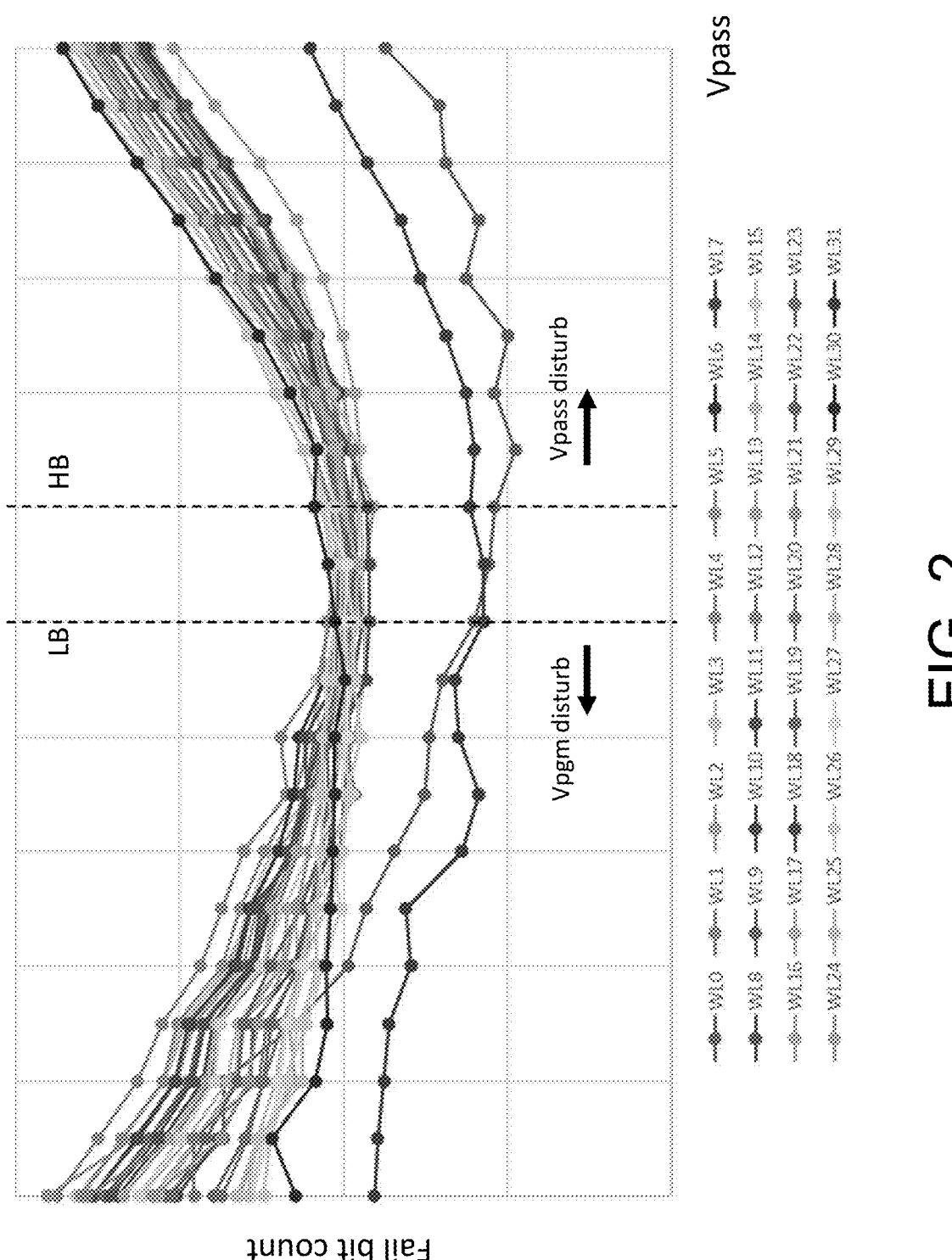
FIG. 2 is a diagram illustrating the relationship between a pass voltage and a fail bit count according to an embodiment of the disclosure.

FIG. 2 is a diagram illustrating the relationship between a pass voltage and a fail bit count according to an embodiment of the disclosure. FIG. 2 is a normalized data diagram.

In the current programming operation, a program voltage (Vpgm) is applied to a selected word line, and a pass voltage (Vpass) is applied to an unselected word line, so as to meet programming requirements. However, when the pass voltage is too low, a high program voltage applied to the selected word line still causes program disturbance to the adjacent unselected word line, thereby resulting in an increase in a fail bit count. On the other hand, in response to a higher pass voltage being applied to the unselected word line, the higher pass voltage may cause a pass voltage disturb (Vpassw disturb) to the data in a memory cell, thereby causing the increase in the fail bit count. In other words, the pass voltage needs to be limited between an appropriate HB and a LB to reduce the fail bit count, thereby improving yield and reliability, as shown in FIG. 2.

Figure 3B:
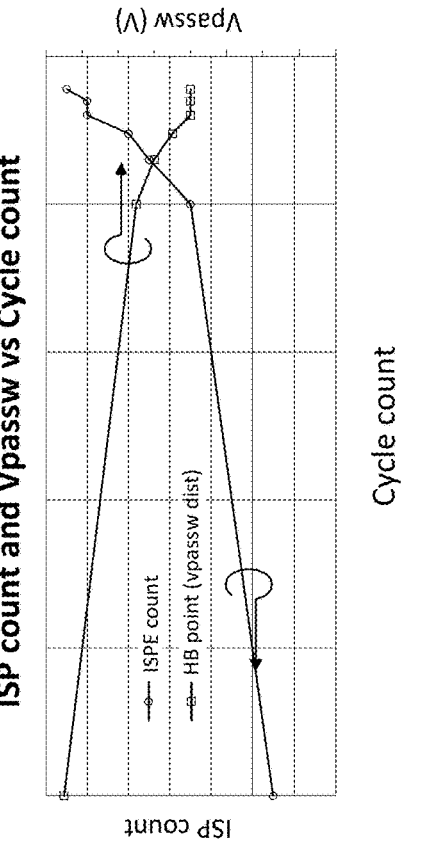
FIG. 3B is a diagram illustrating the relationship between a pulse number, the pass voltage, and a cycle count of the ISPE according to the embodiment of the disclosure.
Figure 3A:
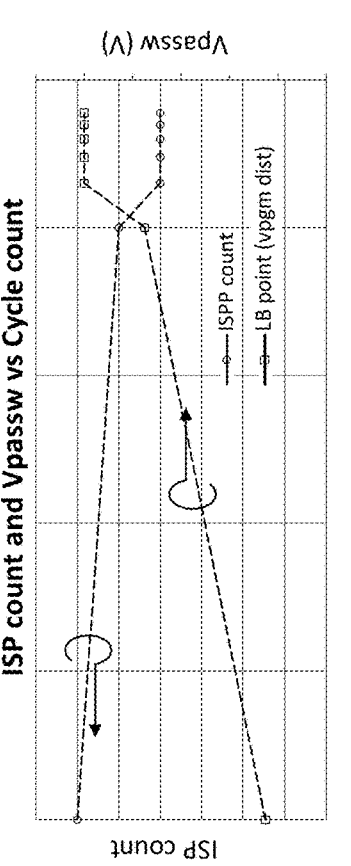
FIG. 3A is a diagram illustrating the relationship between a pulse number, a pass voltage, and a cycle count of the ISPP according to the embodiment of the disclosure
Figure 4B:
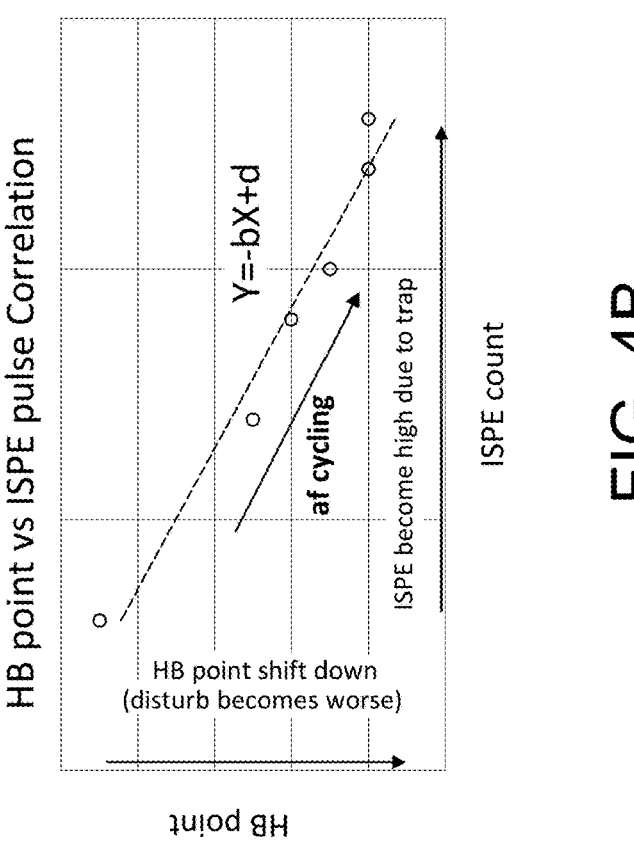
FIG. 4B is a diagram illustrating the relationship between a pulse number of the ISPE and a high boundary value of the pass voltage according to the embodiment of the disclosure.
Figure 4A:
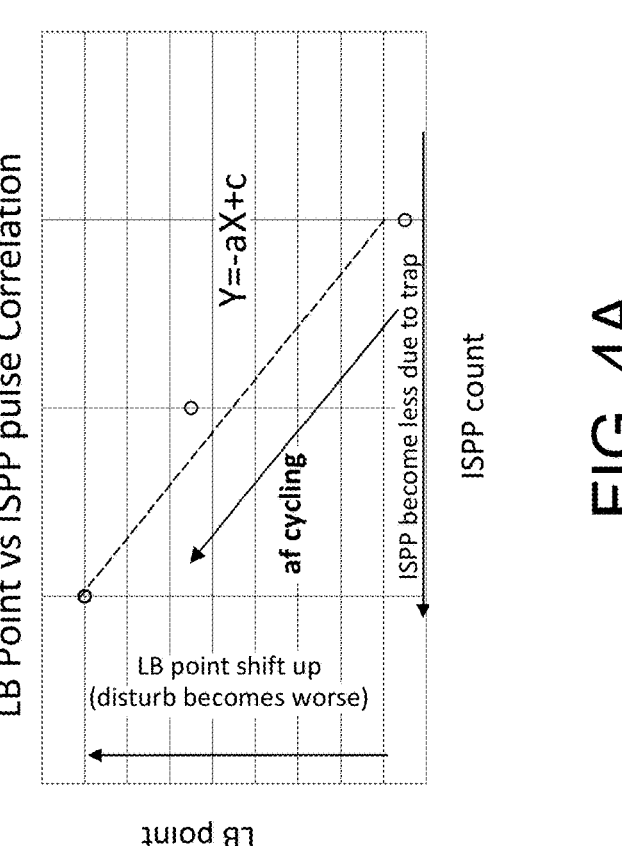
FIG. 4A is a diagram illustrating the relationship between a pulse number of the ISPP and a low boundary value of the pass voltage according to the embodiment of the disclosure.

Typically, an endurance of the memory cell may be tested through multiple program/erase cycles. The so-called program/erase cycle is obtained by repeatedly applying a program pulse with a certain voltage and an erase pulse with a certain voltage. As a program/erase cycle count increases, a degradation of Gm (transconductance) caused by charge trap becomes more significant, making it difficult for current to flow in the memory cell. In this case, as the cycle count gradually increases, a threshold value (Vth) of the memory cell gradually shifts in a positive direction. Since the memory cell is programmed by raising the threshold value, the increase in the cycle count makes programming easier. That is, the programming speed becomes faster. In response to a program verification voltage in ISPP is the same, the verification may be passed at a lower voltage of the program pulse. FIG. 3A is a diagram illustrating the relationship between a pulse number, the pass voltage, and the cycle count of the ISPP according to the embodiment of the disclosure. FIG. 3A is a normalized data diagram. As shown in FIG. 3A, the pulse number of the ISPP may decrease as the cycle count increases; while a low boundary value of the pass voltage increases as the cycle count increases. In other words, the pulse number of the ISPP is inversely proportional to the low boundary value of the pass voltage as the cycle count changes. FIG. 4A is a diagram illustrating the relationship between the pulse number of the ISPP and the LB value of the pass voltage according to the embodiment of the disclosure. FIG. 4A is a normalized data diagram. As shown in FIG. 4A, as the cycle count increases, the pulse number of the ISPP decreases and the low boundary value of the pass voltage increases. Here, the pulse number of the ISPP and the low boundary value of the pass voltage may be expressed by the following formula (A):

$$Y = -aX + c \qquad \text{(A)}$$

X is the pulse number of the ISPP, Y is the lower boundary value of the pass voltage, and a and c are constants greater than zero. In some embodiments, the a is greater than zero and less than 1, and the c may adjust an absolute value of the lower boundary value of the pass voltage according to different product requirements. In alternative embodiments, the a is between 0.2 and 0.5. In other embodiments, the a is between 0.35 and 0.36.

On the other hand, since the erasure of the memory cell reduces the threshold value, the increase in the cycle count makes erasure become difficult. For example, an erasure speed becomes slower. Therefore, the pulse number of ISPE increases as the cycle count increases. Furthermore, in the ISPE, in response to a verification of the erasing failing even with the maximum number of erase pulses applied, the block is managed as a bad block, so an available storage capacity is limited. FIG. 3B is a diagram illustrating the relationship between the pulse number, the pass voltage, and the cycle count of the ISPE according to the embodiment of the disclosure. FIG. 3B is a normalized data diagram. As shown in FIG. 3B, the pulse number of the ISPE may increase as the cycle count increases; while a high boundary value of the pass voltage decreases as the cycle count increases. In other words, the pulse number of the ISPE is inversely proportional to the high boundary value of the pass voltage as the cycle count changes. FIG. 4B is a diagram illustrating the relationship between the pulse number of the ISPE and the HB value of the pass voltage according to the embodiment of the disclosure. FIG. 4B is a normalized data diagram. As shown in FIG. 4B, as the cycle count increases, the pulse number of the ISPE increases and the high boundary value of the pass voltage decreases. Here, the pulse number of the ISPE and the high boundary value of the pass voltage may be expressed by the following formula (B):

$$Y = -bX + d \qquad \text{(B)}$$

X is the pulse number of the ISPP, Y is the high boundary value of the pass voltage, and b is a constant greater than zero. In some embodiments, the b is greater than zero and less than 1, and d may adjust the absolute value of the high boundary value of the pass voltage according to different product requirements. In alternative embodiments, the b is between 0.1 and 0.4. In other embodiments, the b is between 0.17 and 0.18.

Figure 5:
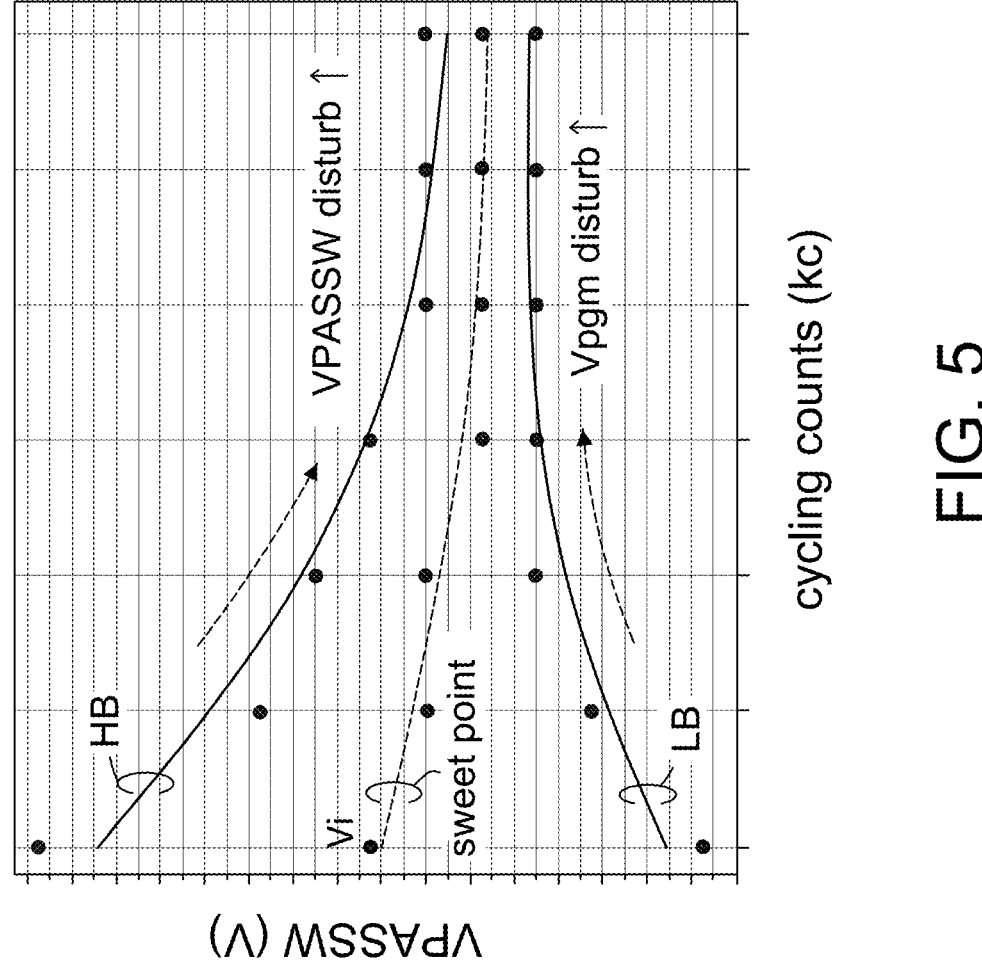
FIG. 5 is a diagram illustrating the relationship between a cycle count and a high boundary value and a low boundary value of the pass voltage according to the embodiment of the disclosure.

FIG. 5 is a diagram illustrating the relationship between the cycle count and the HB value and the LB value of the pass voltage according to the embodiment of the disclosure, in which FIG. 5 is a normalized data diagram. As shown in FIG. 5, the high boundary value and low boundary value of the pass voltage converges as the cycle count increases. In this case, in response to the pass voltage being set to a fixed initial value (Vi), the initial value (Vi) exceeds the high boundary value of the pass voltage as the cycle count increases, causing the fail bit count to increase beyond a criteria.

To solve the above issue, this embodiment may dynamically adjust a sweet point of the pass voltage so that the pass voltage continues to be located between the HB value and the LB value that converge as the cycle count increases, thereby reducing the fail bit count and effectively improving the yield and the reliability. Please refer to the following paragraphs for detailed steps of the method of optimizing pass voltage in this embodiment.

Figure 6:
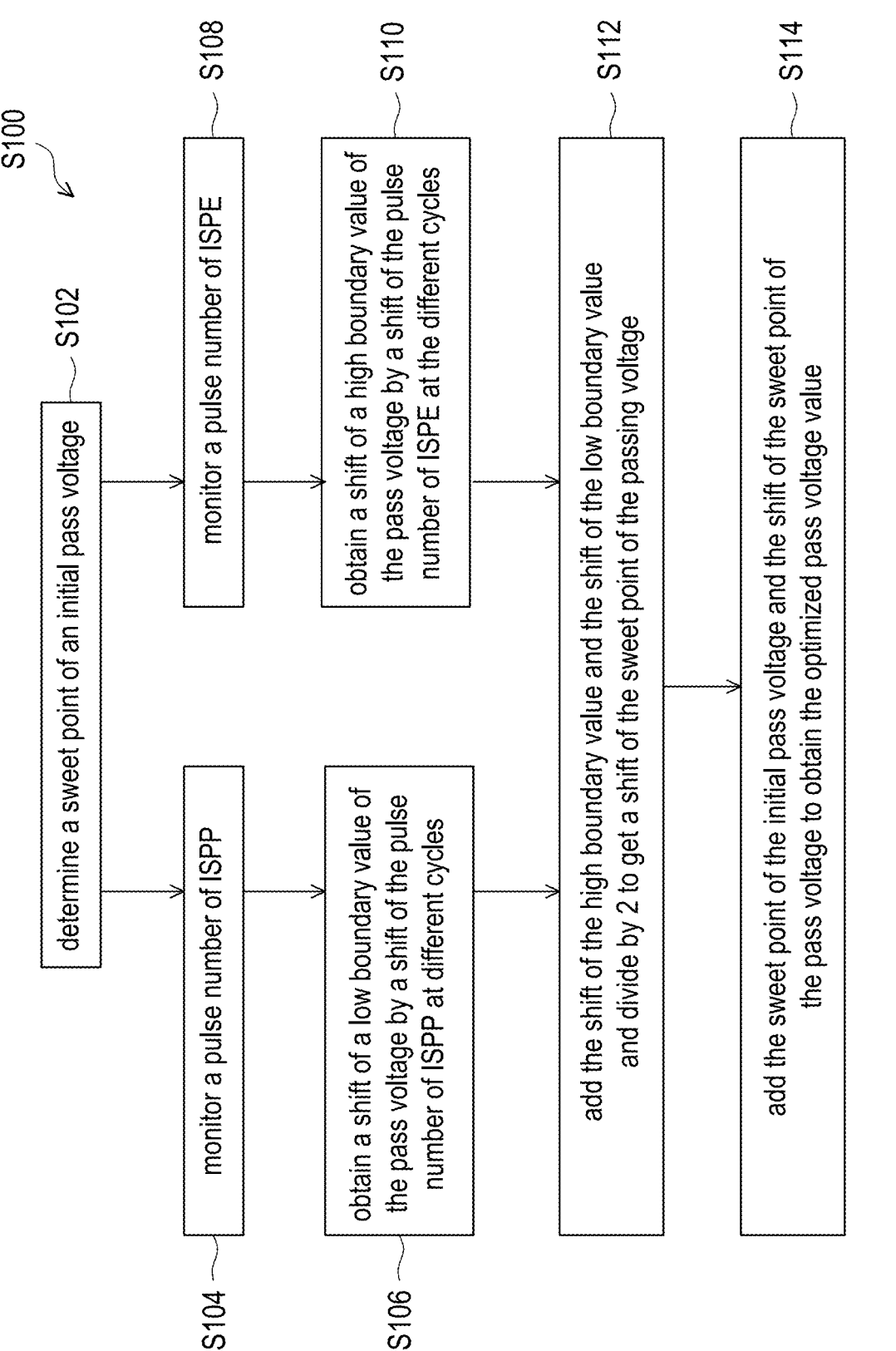
FIG. 6 illustrates a flowchart of a method of optimizing pass voltage according to the embodiment of the disclosure.

FIG. 6 illustrates a flowchart of a method S100 of optimizing pass voltage according to an embodiment of the disclosure.

Referring to FIG. 6, first, step S102 is performed to determine the sweet point of an initial pass voltage. In an embodiment, the sweet point of the initial pass voltage is an experimental value obtained by changing the pass voltage to read each of the word lines before performing the program/ erase cycle (i.e., 0 cycling count). The sweet point of the initial pass voltage may vary based on technology node and product differences.

Figure 1B:
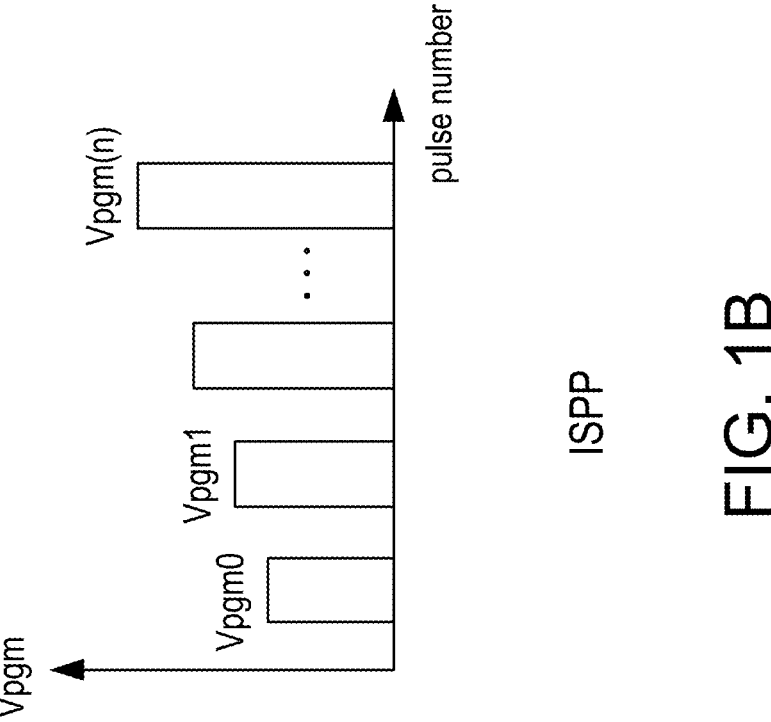
FIG. 1B illustrates a schematic diagram of a flash memory using ISPE to perform a program operation.

Next, step S104 is performed to monitor the pulse number of the ISPP. Specifically, as shown in FIG. 1B, the ISPP operation is to apply a program pulse Vpgm0 to a selected page. When the verification of the programming fails, applies a program pulse Vpgm1 at a step voltage higher than the program pulse Vpgm0, so that the voltage of the program pulse increases until the programming of all of the memory cells in the page is judged to be passed. In an embodiment, the pulse number of the ISPP after each of the cycles is monitored and recorded.

Then, step S106 is performed to obtain the shift of the low boundary value of the pass voltage through the shift of the pulse number of ISPP at different cycles. Specifically, a first pulse number X1 of the ISPP at a first cycle is monitored. A second pulse number X2 of the ISPP at a second cycle is monitored. Next, the first pulse number X1 and the second pulse number X2 are put into equation (1) to calculate the shift of the low boundary value of the pass voltage.

$$Y1 = -a(X2 - X1) \qquad (1)$$

Y1 is the shift of the low boundary value of the pass voltage, and a is a constant greater than zero.

In some embodiments, the a is greater than zero and less than 1. In alternative embodiments, the a is between 0.2 and 0.5. In other embodiments, the a is between 0.35 and 0.36. Afterwards, step S108 is performed to monitor the pulse number of the ISPE.

Figure 1A:
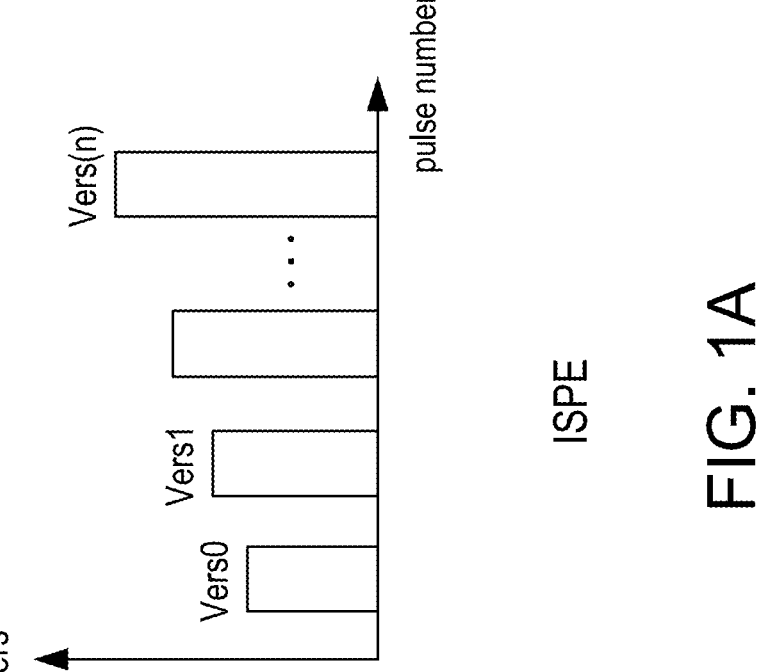
FIG. 1A is a schematic diagram of a flash memory using ISPE to perform an erase operation.

Specifically, as shown in FIG. 1A, the ISPE operation is to apply an erase pulse Vers0 to a P-type well (P-well) of the selected block. When the verification of the erasing fails, applies an erase pulse Vers1 at a step voltage higher than the erase pulse Vers0, so that the voltage of the erase pulse increases until the erasing of all of the memory cells in the page is judged to be passed. In an embodiment, the pulse number of the ISPE after each of the cycles is monitored and recorded.

Then, step S110 is performed to obtain the shift of the high boundary value of the pass voltage through the shift of the pulse number of the ISPE at different cycles. Specifically, a third pulse number X3 of the ISPE at the first cycle is monitored. A fourth pulse number X4 of the ISPP at the second cycle is monitored. Next, the third pulse number X3 and the fourth pulse number X4 are put into equation (2) to calculate the shift of the high boundary value of the pass voltage.

$$Y2 = -b(X4 - X3) \qquad (2)$$

Y2 is the shift of the high boundary value of the pass voltage, and b is a constant greater than zero.

In some embodiments, the b is greater than zero and less than 1. In alternative embodiments, the b is between 0.1 and 0.4. In other embodiments, the b is between 0.17 and 0.18.

Next, step S112 is performed to add the shift Y2 of the high boundary value and the shift Y1 of the low boundary value and divide by 2 (that is, (Y2+Y1)/2) to obtain the shift of the sweet point of the pass voltage.

Then, step S114 is performed to add the sweet point of the initial pass voltage and the shift of the sweet point of the pass voltage to obtain an optimized pass voltage value. In this embodiment, the optimized pass voltage value may continuously be located between the HB value and the LB value that converge as the cycle count increases, thereby reducing the fail bit count and effectively improving the yield and the reliability, compared to the fixed pass voltage, an error-correcting code (ECC) of the optimized pass voltage after 20,000 cycles can be improved from 25 to 4. That is, the embodiments of the disclosure can effectively improve the yield and the reliability.

What is claimed is:

1. A method of optimizing a pass voltage of a memory device, wherein the method is performed by a processor, and when performing the method, the processor is configured to:
    determining a sweet point of an initial pass voltage under no pulse programming/pulse erase operations;
    monitoring a pulse number of incremental step pulse programming (ISPP);
    obtaining a shift of a low boundary value of the pass voltage by a shift of the pulse number of the ISPP at different cycles;
    monitoring a pulse number of incremental step pulse erase (ISPE);
    obtaining a shift of a high boundary value of the pass voltage by a shift of the pulse number of the ISPE at the different cycles;
    adding the shift of the high boundary value and the shift of the low boundary value and dividing by 2 to get a shift of a sweet point of the pass voltage; and
    adding the sweet point of the initial pass voltage and the shift of the sweet point of the pass voltage to obtain an optimized pass voltage value, wherein the optimized pass voltage is continuously located between the high boundary value and the low boundary value that converge as a cycle count increases, and a fail bit count of the memory device is reduced by using the optimized pass voltage.

2. The method of optimizing the pass voltage of the memory device according to claim 1, wherein obtaining the shift of the low boundary value of the pass voltage by the shift of the pulse number of the ISPP at the different cycles comprises:
    monitoring a first pulse number X1 of the ISPP at a first cycle;
    monitoring a second pulse number X2 of the ISPP at a second cycle; and
    putting the first pulse number X1 and the second pulse number X2 into an equation (1) to calculate the shift of the low boundary of the pass voltage, $$Y1 = -a(X2 - X1) \qquad (1)$$

wherein Y1 is the shift of the low boundary of the pass voltage, and a is a constant greater than zero.

3. The method of optimizing the pass voltage of the memory device according to claim 2, wherein a is greater than zero and less than 1.

4. The method of optimizing the pass voltage of the memory device according to claim 2, wherein a is between 0.2 and 0.5.

5. The method of optimizing the pass voltage of the memory device according to claim 2, wherein a is between 0.35 and 0.36.

6. The method of optimizing the pass voltage of the memory device according to claim 1, wherein obtaining the shift of the high boundary value of the pass voltage by the shift of the pulse number of the ISPE at the different cycles comprises:

monitoring a third pulse number X3 of the ISPE at a first cycle;

monitoring a fourth pulse number X4 of the ISPP at a second cycle; and putting the third pulse number X3 and the fourth pulse number X4 into an equation (2) to calculate the shift of the high boundary value of the pass voltage, $$Y2 = -b(X4 - X3) \qquad (2)$$

wherein Y2 is the shift of the high boundary value of the pass voltage, and b is a constant greater than zero.

7. The method of optimizing the pass voltage of the memory device according to claim 6, wherein b is greater than zero and less than 1.

8. The method of optimizing the pass voltage of the memory device according to claim 6, wherein b is between 0.1 and 0.4.

9. The method of optimizing the pass voltage of the memory device according to claim 6, wherein b is between 0.17 and 0.18.

10. The method of optimizing the pass voltage of the memory device according to claim 1, wherein the pulse number the ISPP decreases as a cycle count increases.

11. The method of optimizing the pass voltage of the memory device according to claim 1, wherein the low boundary value of the pass voltage increases as a cycle count increases.

12. The method of optimizing the pass voltage of the memory device according to claim 1, wherein the pulse number of the ISPP is inversely proportional to the low boundary value of the pass voltage as a cycle count changes.

13. The method of optimizing the pass voltage of the memory device according to claim 1, wherein the pulse number of the ISPE increases as a cycle count increases.

14. The method of optimizing the pass voltage of the memory device according to claim 1, wherein the high boundary value of the pass voltage decreases as a cycle count increases.

15. The method of optimizing the pass voltage of the memory device according to claim 1, wherein the pulse number of the ISPE is inversely proportional to the high boundary value of the pass voltage as a cycle count changes.

16. The method of optimizing the pass voltage of the memory device according to claim 1, wherein the high boundary value and low boundary value of the pass voltage converges as a cycle count increases.

17. The method of optimizing the pass voltage of the memory device according to claim 16, wherein the optimized pass voltage value converges between the high boundary value and the low boundary value as the cycle count increases.

18. The method of optimizing the pass voltage of the memory device according to claim 1, wherein the method is suitable for a NAND flash memory.

* * * * *